US008981750B1

(12) United States Patent
Meher et al.

(10) Patent No.: US 8,981,750 B1
(45) Date of Patent: Mar. 17, 2015

(54) ACTIVE REGULATOR WAKE-UP TIME IMPROVEMENT BY CAPACITIVE REGULATION

(71) Applicant: SanDisk Technologies Inc., Plano, TX (US)

(72) Inventors: Deepak Kumar Meher, Bangalore (IN); Sridhar Yadala, Bangalore (IN); Subodh Taigor, Bangalore (IN)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 13/972,100

(22) Filed: Aug. 21, 2013

(51) Int. Cl.
*G05F 1/40* (2006.01)
*H02M 3/156* (2006.01)

(52) U.S. Cl.
CPC ..................................... *H02M 3/156* (2013.01)
USPC .......................................................... 323/282

(58) Field of Classification Search
USPC ........................... 323/268, 273, 282, 283, 351
See application file for complete search history.

(56) References Cited

U.S. PATENT DOCUMENTS

| | | | | |
|---|---|---|---|---|
| 5,448,156 A * | 9/1995 | Tsay | | 323/312 |
| 5,721,485 A | 2/1998 | Hsu et al. | | |
| 5,910,738 A | 6/1999 | Shinohe et al. | | |
| 6,046,624 A | 4/2000 | Nam et al. | | |
| 6,127,786 A * | 10/2000 | Moisin | | 315/291 |
| 7,206,230 B2 | 4/2007 | Li et al. | | |
| 7,319,314 B1 | 1/2008 | Maheshwari et al. | | |
| 7,352,210 B2 * | 4/2008 | Luo | | 326/82 |
| 7,372,320 B2 | 5/2008 | Pan | | |
| 7,400,186 B2 * | 7/2008 | Tschanz et al. | | 327/534 |
| 7,672,674 B2 * | 3/2010 | Mahany et al. | | 455/452.2 |
| 7,719,244 B2 * | 5/2010 | Heilmann | | 323/282 |
| 7,973,594 B2 * | 7/2011 | Amrutur et al. | | 327/544 |
| 8,031,550 B2 * | 10/2011 | Chen | | 365/227 |
| 8,294,442 B2 | 10/2012 | Zhu | | |
| 8,629,697 B2 | 1/2014 | Kim | | |
| 2002/0089317 A1 | 7/2002 | Khouri et al. | | |
| 2006/0119421 A1 | 6/2006 | Kouno et al. | | |
| 2011/0133710 A1 | 6/2011 | Pancholi et al. | | |
| 2011/0181257 A1 | 7/2011 | Pancholi et al. | | |
| 2013/0069608 A1 | 3/2013 | Gakhar et al. | | |
| 2013/0169251 A1 | 7/2013 | Wan et al. | | |

OTHER PUBLICATIONS

U.S. Appl. No. 13/750,794 entitled "LDO/HDO Architecture Using Supplementary Current Source to Improve Effective System Bandwidth," filed Jan. 25, 2013, 21 pages.
U.S. Appl. No. 13/750,808 entitled "Improvements in Settling Time and Effective Band Width for Op-Amps Using Miller Capacitance Compensation," filed Jan. 25, 2013, 20 pages.
Notification of Transmittal of The International Search Report and the Written Opinion of the International Searching Authority, or the Declaration for Int'l Appl. No. PCT/US2014/049265 mailed Nov. 4, 2014, 11 pages.

* cited by examiner

*Primary Examiner* — Adolf Berhane
(74) *Attorney, Agent, or Firm* — Davis Wright Tremaine LLP (57) ABSTRACT

An active voltage regulator circuit having improved wake-up response is presented. The circuit includes an op-amp whose output is connected to a pass device for supplying the output level, and has both capacitive and resistive parts in its feedback loop. When the regulator is enabled, the capacitive elements are initially connected, followed after a delay by the resistive elements of the feedback loop.

15 Claims, 6 Drawing Sheets

ACTIVE REGULATOR WAKE-UP TIME IMPROVEMENT BY CAPACITIVE REGULATION

FIELD OF THE INVENTION

This invention pertains generally to the field of voltage regulation circuits and, more particularly, to their wake-up behavior.

BACKGROUND

Voltage regulators are commonly found as peripheral elements on integrated circuits needing well regulated voltage levels for their operations. For example, a typical NAND memory chip has internal active and standby power supply regulators. During the transition from a standby mode to an active mode, although power supply level (the regulators' output) is initialized to desired level, active regulators tend to suffer from long wake-up times. High RC time constants, associated with the regulator's feedback loop, delays loop response during wake-up. Furthermore, high load currents can cause the power supply's output level to droop. This droop can be significantly high. The impact can be seen as a wrong data transfer, which becomes more evident at double data rate (DDR) speeds.

SUMMARY OF THE INVENTION

According to a general aspect of the invention, a method of operating a voltage regulator circuit to provide an output voltage level on an output node is presented. The regulator circuit includes a pass transistor connected between a supply level and the output node of the voltage regulator circuit and has a gate connected to an output node of an op-amp having first and second inputs, where the first input of the op-amp is connected to receive a reference voltage. The method includes operating the voltage regulator in a standby mode and subsequently operating the voltage regulator circuit in an active mode. In the standby mode the op-amp's output node is connected to receive the supply level. In the active mode the op-amp's output node is not connected to receive the supply level, the output node of the voltage regulator circuit is connected to ground through a resistive voltage divider, and the second input of the op-amp is connected to a node of the resistive voltage divider. In transitioning from the standby mode to the active mode, the connection of the second input of the op-amp to the node of the resistive voltage divider is delayed relative to disconnecting of the op-amp's output node from the supply level and the connecting of the voltage regulator circuit's output node to ground through the resistive voltage divider.

In other aspects, voltage regulation circuitry provides an output voltage level on an output node. The voltage regulation circuitry includes an op-amp and a pass transistor. The op-amp has first and second inputs, where the first input is connected to receive a reference voltage, and an output of the op-amp is connectable to a supply level through a second switch. The pass transistor is connected between the supply level and the output node of the voltage regulator circuitry and having a gate connected to the output node of the op-amp. First and second resistances are connected in series between the voltage regulator circuitry's output node and, through a third switch, ground, wherein the second input of the op-amp is connectable to a node between the first and second resistances through a fourth switch. First and second capacitors are connected in series between the op-amp's output node and the second input of the op-amp and having an intermediate node between the first and second capacitors connected to the output node of the voltage regulator circuitry. When operating in a standby mode, the first switch and second switches are on and the third and fourth switches are off; when operating in an active mode, the first and second switches are off and the third and fourth switches are on, and, when transitioning from the standby mode to the active mode, the turning on of the fourth switch is delayed relative to the turning off of the first and second switches and the turning on of the third switch.

Various aspects, advantages, features and embodiments of the present invention are included in the following description of exemplary examples thereof, whose description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of twits between any of the incorporated publications, documents or things and the present application, those of the present application shall prevail.

DETAILED DESCRIPTION

The following considers techniques for improving the wake-up response of voltage regulators. More specifically, the regulator's feedback loop response is improved by pushing the active regulator in capacitive feed-back mode only during wake-up. This speeds up the loop response, hence improves wake-up time.

Figure 1:
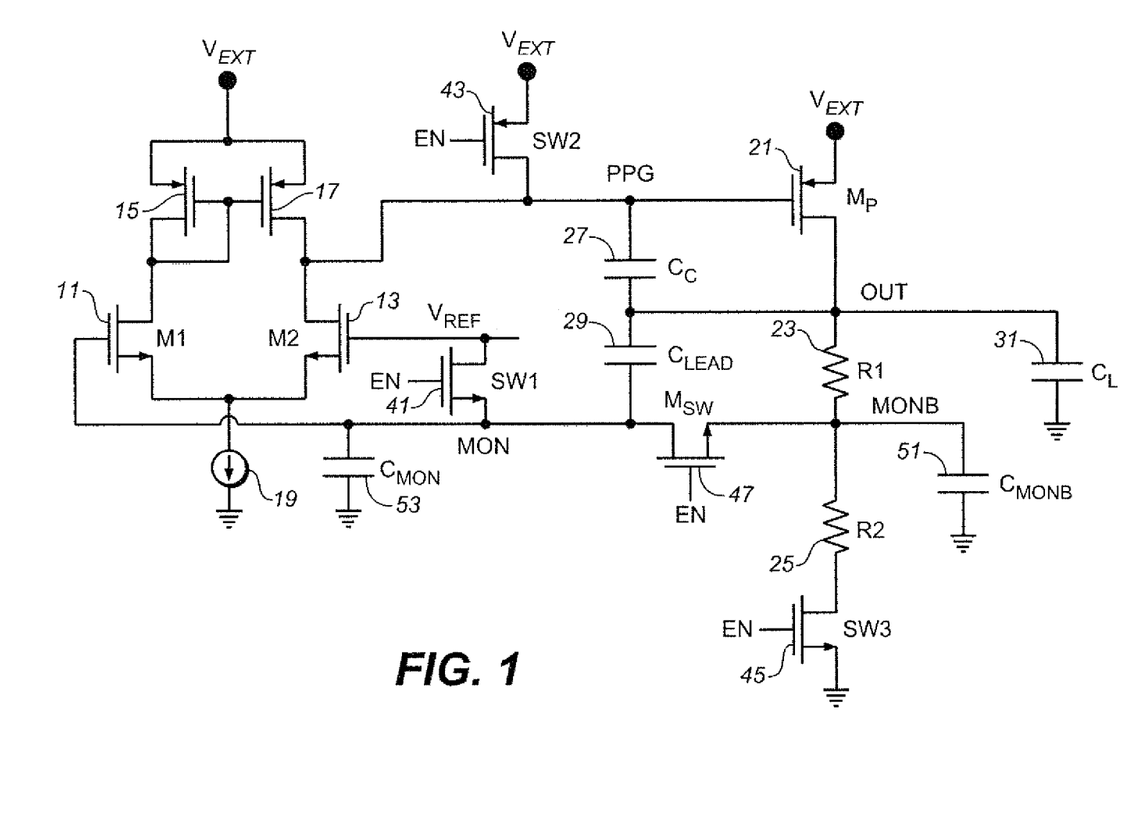
FIG. 1 shows an example of a voltage regulator circuit.
Figure 2:
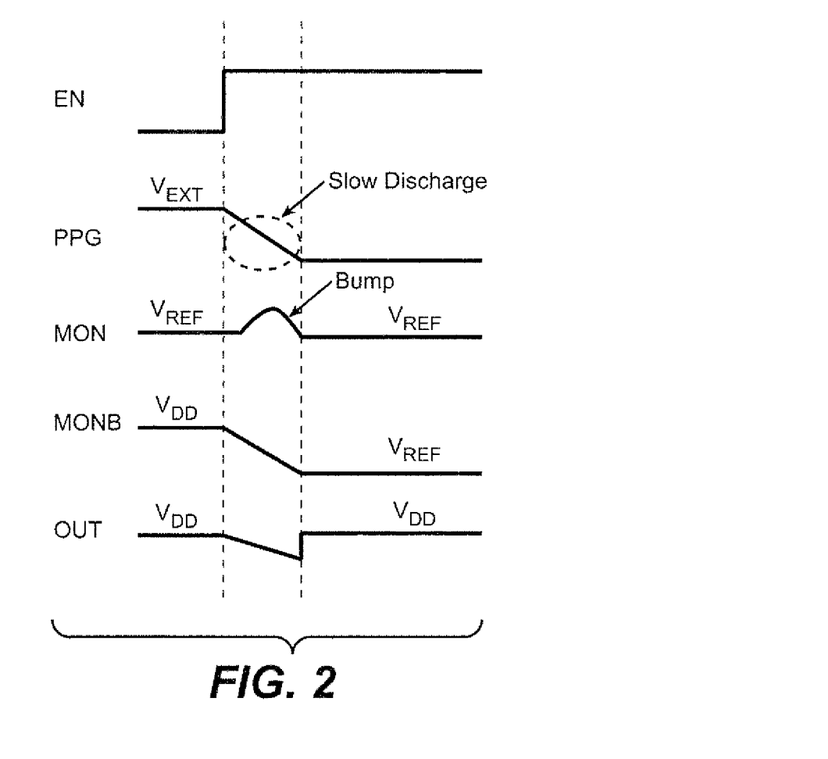
FIG. 2 is a set of waveforms showing the wake-up behavior of the circuit of FIG. 1.

For background, FIG. 1 illustrates an example of a regulator circuit and FIG. 2 is a set of waveforms to shows its wake-up behavior. In FIG. 1, a pass device $M_P$ 21 is connected between the supply level $V_{EXT}$ the regulator's output node OUT that can be applied to a load, here represented by $C_L$ 31. The gate of $M_P$ 21 is connected to output node PPG of an op-amp. The op-amp is here implemented as having its first input connected to the gate of a transistor M1 11 and its second input connected to the gate of a transistor M2 13, where M1 11 and M2 13 are both connected to ground though a current source 19 and respectively connected to the supply level through PMOS 15 and PMOS 17, where the gates of both of these PMOS are connected to a node between M1 11 and PMOS 15. The output PPG is then taken from a node between M2 13 and PMOS 17. Although this particular implementation of the op-amp is used in all of the following discussion, other standard implementations and variations can be used.

The gate of M2 13 is connected to a reference level $V_{REF}$, such as would be supplied from a band-gap circuit, for example, and the node MON for the gate of M1 11 is also connectable (through switch SW1 41) to the reference level or (through switch $M_{SW}$ 47) to an intermediate node MONB of a resistive divider formed of R1 23 and R2 25 connected in series between OUT and (through a switch SW3 45) to ground. A coupling capacitor $C_C$ 27 and a lead capacitor $C_{LEAD}$ 29 are used to increase the stability of the regulator when turned on and are connected in series between PPG and MON, with their intermediate node connected at OUT. PPG is also connectable (through switch SW2 43) to the supply level. FIG. 1 also shows the parasitic capacitances $C_{MON}$ 53 and $C_{MONB}$ 51, where $C_{MON}$ represents device parasitic capacitance and routing capacitance and $C_{MONB}$ represents device parasitic capacitance, the parasitic capacitance of resistors R1 23 and R2 25, and routing capacitance.

In the exemplary embodiment, SW1 41, SW3 45, and $M_{SW}$ 47 are implemented as NMOS devices and SW2 43 is implemented as a PMOS device. SW2 43, SW 3 45, and $M_{SW}$ 47 have their gates connected to receive the enable signal EN for the regulator, while SW1 41 receives the inverse of EN at its gate. Here, EN is the control signal that determines whether the chip is working in standby mode or active mode. Consequently, when EN is low, SW1 41 and SW2 43 are on, SW3 45 and $M_{SW}$ 47 are off; and EN is high, SW1 41 and SW2 43 are off, SW3 45 and $M_{SW}$ 47 are on. The regulator is enabled by EN going high. The regulator here is taken to be an example of an active regulator capable of driving the load when active. For example, a NAND memory chip typically has standby mode and active modes. Active regulators work in the active mode whereas a standby regulator is used in the standby mode to maintain voltage levels, but need not drive the active circuit. The outputs of the regulators can be connected and, depending upon the mode of the chip, either the standby or the active regulator will drive the output. Consequently, only one of the active regulator and standby regulator need to be on at any time, depending on the mode. While still able to maintain a steady supply in standby situations, the standby regulator itself consumes less power and it can deliver less power to the load, whereas the active regulator consumes more power and is capable of driving a high current load. In the exemplary embodiment, the switch SW1 41 connects the gate of M1 11 to $V_{REF}$ during standby; more generally, as the actively regulator is turned off, this input of the op-amp could be any value while off, but connecting it to the reference level allows for faster settling.

FIG. 2 shows a corresponding set of control signals for FIG. 1. Before turning on the regulator, the regulator EN=0 and the device is in standby mode, with PPG connected to $V_{EXT}$ and MON connected to $V_{REF}$. The regulator output is initialized to $V_{DD}$, where $V_{DD}$ is the final regulation voltage, by a standby regulator (not shown in FIG. 1 or 3) connectable to OUT. The MONB node is the same as $V_{DD}$ due to there being no current in the resistive path. After the regulator is on (EN=1), a wake-up process begins as MONB node discharges to $V_{REF}$. The MONB node has two discharge paths: through R2 25 to ground and through $M_{SW}$ 47 to $C_{LEAD}$ 29. The R2 to ground current path will help in discharging, while $M_{SW}$ to $C_{LEAD}$ is an additional current path that is created due to different initial voltages at the MONB and MON nodes. This will make MON node rising above $V_{REF}$ during the wake period, as shown at the bump. Since the potential at MON node is more than $V_{REF}$, the current in M2 13 will be less the current in M1 11, slowing the discharge of the PPG node and causing wake-up time to increase. If the load draws current is before the regulator is settled, the OUT droop further increases. Because of this, internal circuits using this supply may fail to respond, resulting in error in data transfer.

One way that wake-up time can be reduced by increasing the tail current of the op-amp; however, this increases the power consumption of the circuit. Another way to deal with the problem is to have a separate discharge path for the high capacitive node at the gate of the pass device $M_P$ 21; but again, this takes extra power and the duration of discharge has to be precisely controlled across process variations. If the discharge is higher than required, an unwanted overshoot will be seen at the regulator output.

Figure 3:
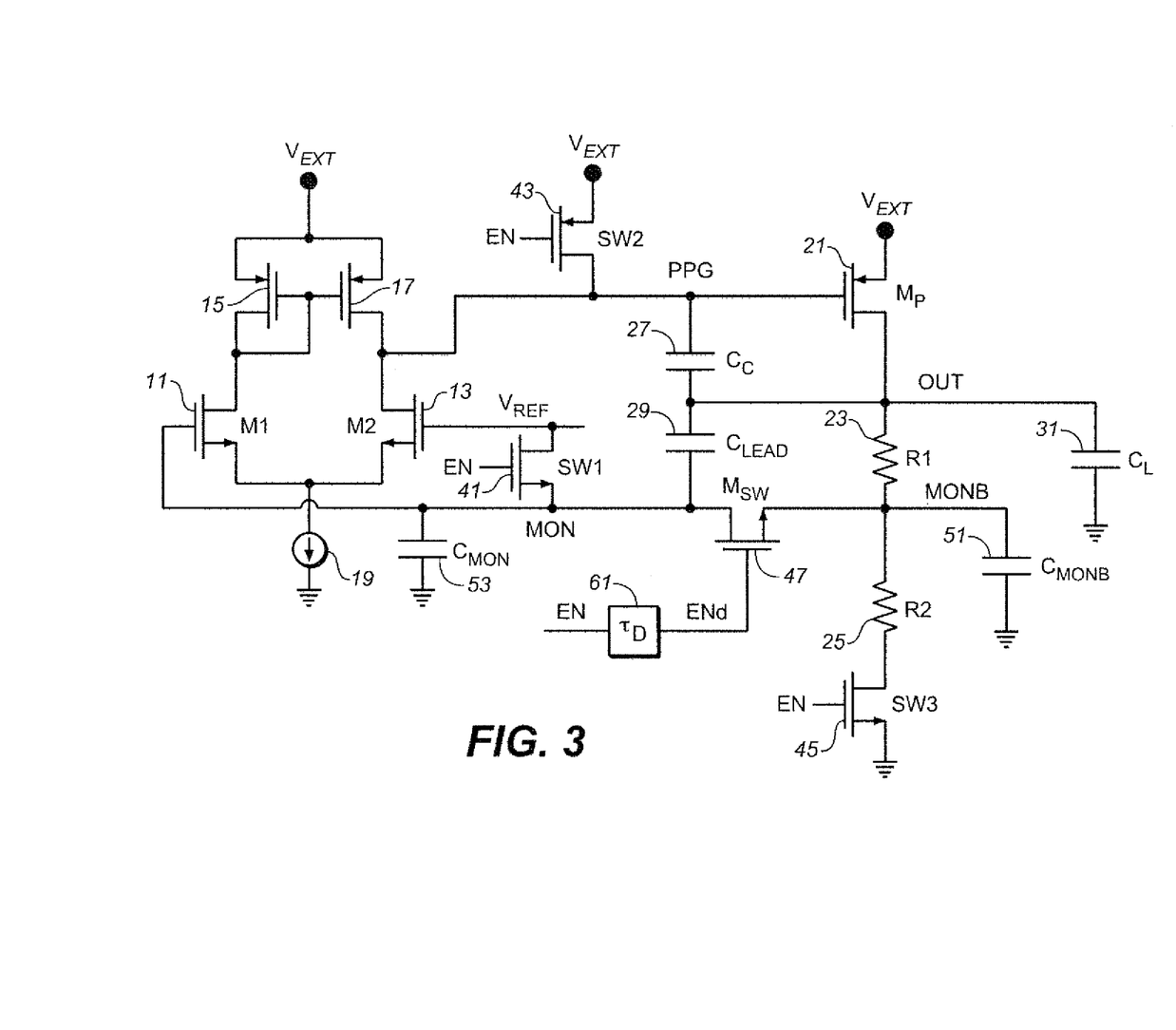
FIG. 3 shows an exemplary embodiment of a voltage regulator circuit.

FIG. 3 presents an exemplary embodiment of a voltage regulator circuit incorporating aspects to improve wake-up response without these drawbacks. FIG. 3 incorporates the same elements as FIG. 1, but also incorporates a delay element $\tau_D$ 61. Rather than $M_{SW}$ 47 having its gate connected to receive EN directly, it instead receives a delayed version ENd that the delay element $\tau_D$ 61 generates from EN. The delay can be implemented by a RC network, where the resistor used in the RC network can be the same as the resistor used in the voltage divider of the regulator.

Figure 4:
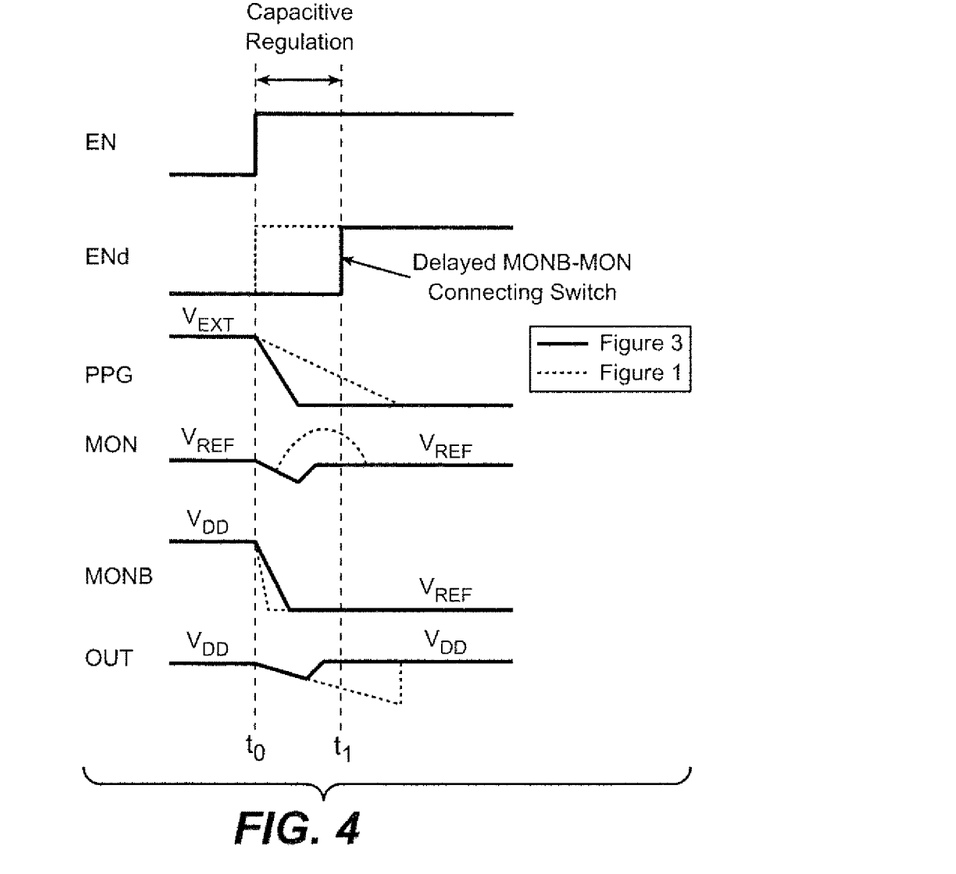
FIG. 4 is a set of waveforms showing the wake-up behavior of the circuit of FIG. 3.

FIG. 4 illustrates the control signals for FIG. 3, where the control signals for FIG. 1 (as shown in FIG. 2) are overlaid in broken lines for comparison. When EN goes high and the active regulator is turned on, the connection of MONB to MON through $M_{SW}$ 47 is delayed by delaying the control signal ENd. While $M_{SW}$ 47 is off, $C_{LEAD}$ 29 completes the feedback path: i.e., the regulator is in capacitive regulation mode. Due to the initial voltages at both the terminals of $C_{LEAD}$, output node would be regulated to $V_{DD}$. The wake-up time in capacitive regulation will be faster since any decrease in the OUT node (due to the resistive discharge path and output current) will be entirely reflected in the MON node. The MON node will not overshoot $V_{REF}$ as in FIG. 1 and PPG will discharge faster. The delay $\tau_D$ is preferably higher than the time required for the MONB node to discharge to $V_{REF}$ so that the MON node will be unaffected by the discharge of MONB. For example, the MONB node can take, say, five times $(R1\|R2)^*C_{MONB}$ to discharge to VREF. By using the same type of resistor in the delay element as for R1 and R2, any variation in the MONB discharge time will be tracked by the delay element. The lower value of the delay is then $5^*(R1\|R2)^*C_{MONB}$, but there is no maximum limit since a higher delay will not cause any problem due to the capacitive regulation. After the loop is settled, the MON node will be same as $V_{REF}$ due to high loop gain, forcing the output of the regulator to settle at $V_{DD}$ itself. By taking the final regulation voltage of capacitive and resistive regulation to be the same, no extra time is taken during the transition from capacitive regulation to resistive regulation.

Figure 5:
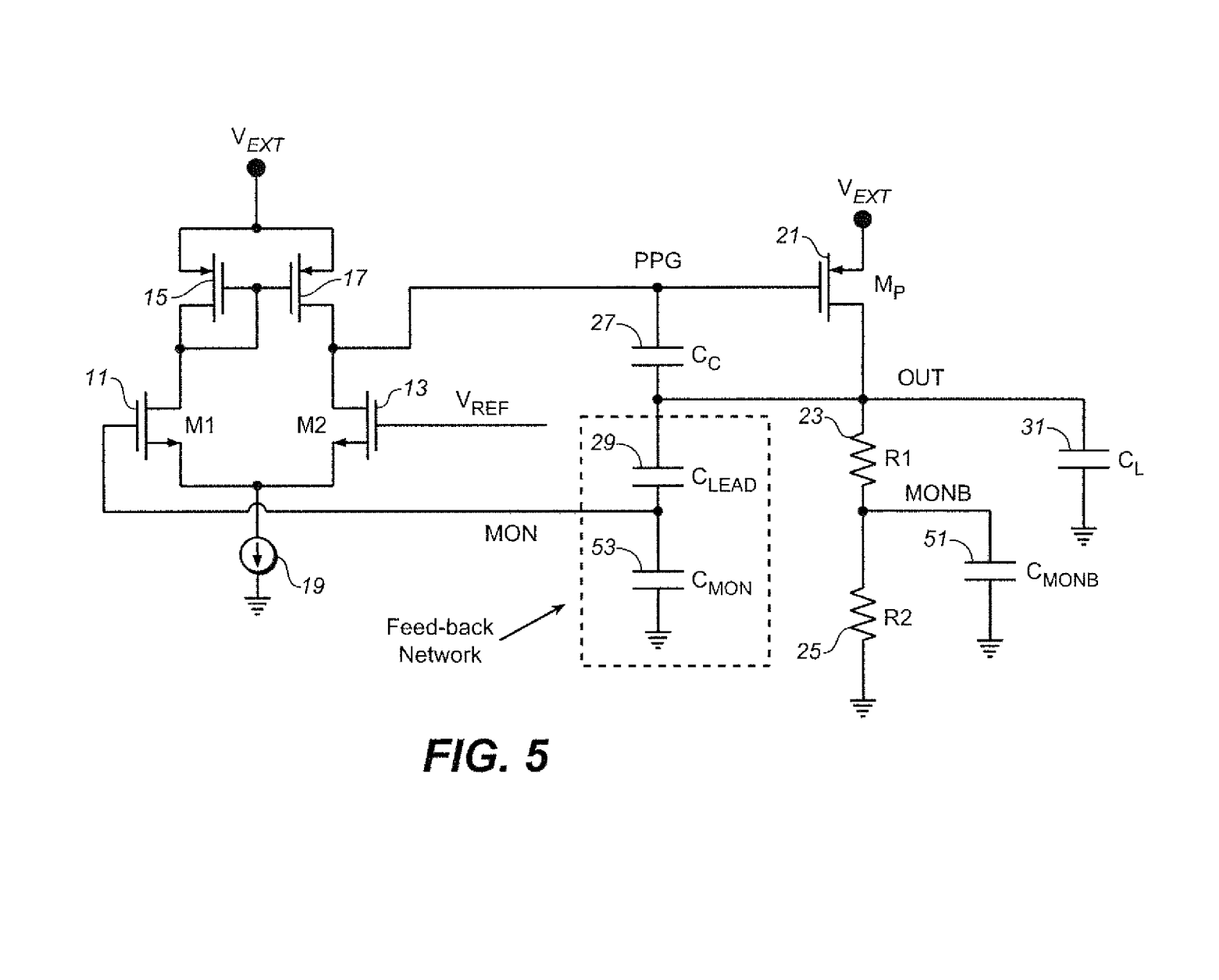
FIG. 5 is an equivalent circuit for FIG. 3 when under capacitive regulation.

To further consider the settling output level during the capacitive regulation phase, FIG. 5 considers FIG. 3 when EN has gone high between $t_0$ and $t_1$ in FIG. 4, but the delayed version of ENd is still low. At this point, SW1 41, SW2 43, and $M_{SW}$ 47 are off and SW3 45 is on and FIG. 3 is equivalent to FIG. 5. The OUT and MON nodes are connected through $C_{LEAD}$ 29. As discussed above, $C_{MON}$ 53 is not an actual added circuit element, but only the parasitic capacitance seen at the MON node and which is usually negligible compared to $C_{LEAD}$ ($C_{MON} \ll C_{LEAD}$). The final output settling voltage of the capacitive regulation and the resistive regulation is preferably the same. A detailed derivation for the settling voltage of capacitive regulation is given with reference to FIG. 6, which again shows the control signals of FIG. 3 corresponds to FIG. 4 with the broken lines (that corresponded to FIG. 2) removed and a time $t_p$ indicating when the pass device $M_P$ 21 turns on. The input-output relation of feedback network is derived first and then the final settling voltage is calculated.

Figure 6:
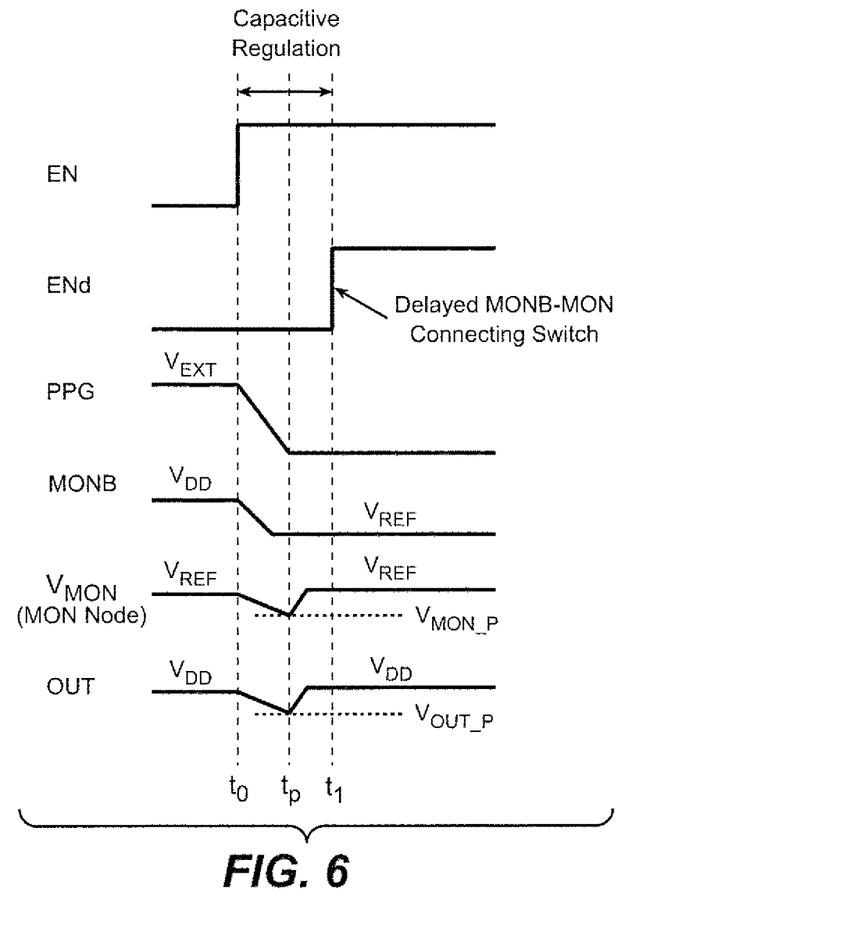
FIG. 6 is a version of FIG. 4 for illustrating the behavior when under capacitive regulation.

Referring to FIG. 6, at any time t, V(OUT)=$V_{OUT}$ and V(MON)=$V_{MON}$. At t=$t_0$ the regulator is enabled (EN goes high) and at t=$t_1$ $M_{SW}$ is turned on (ENd goes high). During standby (t≤$t_0$), $V_{OUT}$(t≤$t_0$)=$V_{DD}$ and $V_{MON}$(t≤$t_0$)=$V_{REF}$. The wake-up period is $t_0$<t<$t_1$. For $t_0$<t<$t_p$, regulator is in open loop ($M_p$ is OFF) and both $C_{LEAD}$ and $C_{MON}$ discharge and the voltage level changes.

At t=$t_p$, $V_{OUT}$=$V_{OUT\_P}$ and $V_{MON}$=$V_{MON\_P}$. Referring to the boxed feedback network of FIG. 5:

$$\Delta V_{MON} = \Delta V_{OUT} * \frac{C_{LEAD}}{C_{LEAD} + C_{MON}} \quad \text{(Equation 1)}$$

$$V_{MON\_P} - V_{REF} =$$

$$(V_{OUT\_P} - V_{DD}) \cdot \frac{C_{LEAD}}{C_{LEAD} + C_{MON}}$$

$$V_{MON\_P} - V_{OUT\_P} \cdot \frac{C_{LEAD}}{C_{LEAD} + C_{par}} =$$

$$V_{REF} - V_{DD} \cdot \frac{C_{LEAD}}{C_{LEAD} + C_{MON}}$$

At t=$t_p$ the PMOS pass device $M_P$ 21 turns on, the loop is closed and the regulator takes some time to settle. Again, by capacitor division, for t≥$t_p$:

$$V_{MON} - V_{MON\_P} = (V_{OUT} - V_{OUT\_P}) \cdot \frac{C_{LEAD}}{C_{LEAD} + C_{MON}} \quad \text{(Equation 2)}$$

$$V_{MON} = \frac{C_{LEAD}}{C_{LEAD} + C_{MON}} \cdot V_{OUT} +$$

$$\left( V_{MON\_P} - V_{OUT\_P} \cdot \frac{C_{LEAD}}{C_{LEAD} + C_{MON}} \right)$$

$$V_{MON} = \beta \cdot V_{OUT} + \alpha$$

where $$\beta = \frac{C_{LEAD}}{C_{LEAD} + C_{MON}}$$

and $$\alpha = V_{MON\_P} - V_{OUT\_P} \cdot \frac{C_{LEAD}}{C_{LEAD} + C_{MON}}$$

Figure 7:
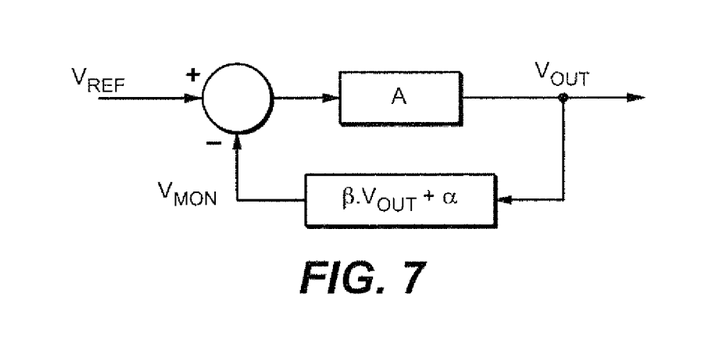
FIG. 7 is a block level representation of FIG. 5.

The input and output of the feedback network are related by a feed-back factor (β) and offset (α), as represented by FIG. 7 that is a block level representation of FIG. 5. This gives:

$$V_{OUT} = \frac{V_{REF} - \alpha}{\frac{1}{A} + \beta} \approx \frac{V_{REF} - \alpha}{\beta} \text{(when } A \text{ is large)} \quad \text{(Equation 3)}$$

Putting the value of α and β from Equation 2 into Equation 3 gives:

$$V_{OUT} \approx \frac{V_{REF} - \left( V_{MON\_P} - V_{OUT\_P} \cdot \frac{C_{LEAD}}{C_{LEAD} + C_{MON}} \right)}{\frac{C_{LEAD}}{C_{LEAD} + C_{MON}}}.$$

Using Equation 1, this becomes:

$$V_{OUT} \approx \frac{V_{REF} - \left( V_{REF} - V_{DD} \cdot \frac{C_{LEAD}}{C_{LEAD} + C_{MON}} \right)}{\frac{C_{LEAD}}{C_{LEAD} + C_{MON}}} \approx V_{DD}$$

Consequently, the final regulation voltage of capacitive regulation is $V_{DD}$, which is same as when under resistive regulation.

Consequently, by employing the aspects described with respect to the embodiment of FIG. 3, settling time during wake-up is reduced by capacitive regulation without taking any extra power. As this technique works in a closed loop, it has less process dependency for the final settling voltage and will also reduce unwanted overshoot at the output.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A method of operating a voltage regulator circuit to provide an output voltage level on an output node, where the voltage regulator circuit includes a pass transistor connected between a supply level and the output node of the voltage regulator circuit and has a gate connected to an output node of an op-amp having first and second inputs, where the first input of the op-amp is connected to receive a reference voltage, the method comprising:
    operating the voltage regulator in a standby mode, wherein the op-amp's output node is connected to receive the supply level; and
    subsequently operating the voltage regulator circuit in an active mode, wherein the op-amp's output node is not connected to receive the supply level, the output node of the voltage regulator circuit is connected to ground through a resistive voltage divider, and the second input of the op-amp is connected to a node of the resistive voltage divider,
    wherein, in transitioning from the standby mode to the active mode, the connection of the second input of the op-amp to the node of the resistive voltage divider is delayed relative to disconnecting of the op-amp's output node from the supply level and the connecting of the voltage regulator circuit's output node to ground through the resistive voltage divider.

2. The method of claim 1, wherein while operating the voltage regulator in a standby mode, the second input of the op-amp is connected to receive the reference voltage.

3. The method of claim 2, wherein the voltage regulator circuit further includes first and second capacitors connected in series between the op-amp's output node and the second input of the op-amp and having an intermediate node between the first and second capacitors connected to the output node of the voltage regulator circuit, wherein operating the voltage regulator in the standby mode further includes:
    disconnecting of the resistive voltage divider from ground.

4. The method of claim 3, wherein the resistive divider is connected to ground through a switch, the switch being on during the active mode and off during the standby mode.

5. The method of claim 2, wherein the op-amp's output node is connected to the supply level through a switch, the switch being on during the standby mode and off during the active mode.

6. The method of claim 2, wherein the op-amp's second input is connected to the reference voltage through a first switch, the first switch being on during the standby mode and off during the active mode.

7. The method of claim 6, wherein the op-amp's second input is connected to the node of the resistive voltage divider through a second switch, the second switch being off during the standby mode and on during the active mode, wherein, in transitioning from the standby mode to the active mode, the turning on of the second switch is delayed relative to the turning off of the first switch.

8. The method of claim 7, wherein the delay in turning on of the second switch is implemented through use of an R-C network.

9. The method of claim 1, wherein operating the voltage regulator in the standby mode further includes connecting the output node of the voltage regulator circuit to a standby regulation circuit to set the output node of the voltage regulator circuit to the output voltage level.

10. Voltage regulation circuitry to provide an output voltage level on an output node, comprising:
an op-amp having first and second inputs, where the first input is connected to receive a reference voltage, and an output of the op-amp is connectable to a supply level through a second switch;
a pass transistor connected between the supply level and the output node of the voltage regulator circuitry and having a gate connected to the output node of the op-amp;
first and second resistances connected in series between the voltage regulator circuitry's output node and, through a third switch, ground, wherein the second input of the op-amp is connectable to a node between the first and second resistances through a fourth switch; and
first and second capacitors connected in series between the op-amp's output node and the second input of the op-amp and having an intermediate node between the first and second capacitors connected to the output node of the voltage regulator circuitry,
wherein, when operating in a standby mode, the first switch and second switches are on and the third and fourth switches are off; when operating in an active mode, the first and second switches are off and the third and fourth switches are on; and, when transitioning from the standby mode to the active mode, the turning on of the fourth switch is delayed relative to the turning off of the first and second switches and the turning on of the third switch.

11. The voltage regulation circuitry of claim 10, wherein the second input of the op-amp is connectable through a first switch to the reference voltage.

12. The voltage regulation circuitry of claim 11, wherein the first, third and fourth switches are implemented as NMOS devices and the second switch is implemented as a PMOS device, where the gates of the second, third and fourth switches are connected to receive an enable signal and the first switch is connected to receive the enable signal in inverted form.

13. The voltage regulation circuitry of claim 12, wherein the fourth switch is connected to receive the enable signal through a delay element.

14. The voltage regulation circuitry of claim 13, wherein the delay element is implemented through use of an R-C network.

15. The voltage regulation circuitry of claim 10, wherein the voltage regulation circuitry further includes a standby voltage regulator, wherein operating the voltage regulator circuit is operating in the standby mode the output node of the voltage regulator circuitry is connected to the standby regulation circuit to set the output node of the voltage regulator circuitry to the output voltage level.

* * * * *